(12) United States Patent
Dani et al.

(10) Patent No.: US 7,996,989 B2
(45) Date of Patent: Aug. 16, 2011

(54) HEAT DISSIPATING DEVICE WITH PRESELECTED DESIGNED INTERFACE FOR THERMAL INTERFACE MATERIALS

(75) Inventors: Ashay A. Dani, Chandler, AZ (US); Sabina J. Houle, Phoenix, AZ (US); Christopher L. Rumer, Chandler, AZ (US); Thomas J Fitzgerald, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 290 days.

(21) Appl. No.: 12/061,694

(22) Filed: Apr. 3, 2008

(65) Prior Publication Data
US 2008/0185713 A1 Aug. 7, 2008

Related U.S. Application Data

(62) Division of application No. 10/612,834, filed on Jun. 30, 2003, now Pat. No. 7,527,090.

(51) Int. Cl.
*H05K 7/20* (2006.01)
(52) U.S. Cl. ............ 29/890.03; 165/133; 165/185
(58) Field of Classification Search ........... 29/890.03
See application file for complete search history.

(56) References Cited

U.S. PATENT DOCUMENTS

| 3,790,866 | A | 2/1974 | Meyer et al. |
|---|---|---|---|
| 3,797,103 | A | 3/1974 | Desmond et al. |
| 4,544,942 | A | 10/1985 | McCarthy |
| 4,654,966 | A | 4/1987 | Kohara et al. |
| 4,782,893 | A | 11/1988 | Thomas |
| 5,098,320 | A | 3/1992 | Colleran et al. |
| 5,146,314 | A | 9/1992 | Pankove |
| 5,291,371 | A | 3/1994 | Gruber et al. |
| 5,528,075 | A | 6/1996 | Burns |
| 5,700,340 | A | 12/1997 | Johnson et al. |
| 5,759,873 | A | 6/1998 | Kata et al. |
| 5,820,014 | A | 10/1998 | Dozier, II et al. |
| 5,904,796 | A | 5/1999 | Freuler et al. |
| 5,907,189 | A | 5/1999 | Mertol |
| 5,913,108 | A * | 6/1999 | Stephens et al. ............. 438/109 |
| 5,931,222 | A | 8/1999 | Toy et al. |
| 5,981,085 | A | 11/1999 | Ninomiya et al. |
| 6,008,988 | A | 12/1999 | Palmer |
| 6,022,426 | A | 2/2000 | Mennucci et al. |
| 6,032,362 | A | 3/2000 | Okikawa et al. |
| 6,099,678 | A | 8/2000 | Kotato et al. |

(Continued)

FOREIGN PATENT DOCUMENTS
WO WO-02091395 A1 11/2002
(Continued)

OTHER PUBLICATIONS

"U.S. Appl. No. 10/405,095, Response filed Jan. 4, 2005 Non-Final Office Action mailed Nov. 2, 2004 pp. 5.pdf", 5 pgs.

(Continued)

*Primary Examiner* — Allen J Flanigan
(74) *Attorney, Agent, or Firm* — John N. Greaves (57) ABSTRACT

Embodiments of the invention includes a heat dissipating device. The heat dissipating device includes a main body having a surface, wherein the surface is plated or coated with at least two different metals to form a design effective for bonding to solder and for adhering to polymer in a polymer solder hybrid. The heat dissipating device also includes surface perturbations.

3 Claims, 7 Drawing Sheets

U.S. PATENT DOCUMENTS

| | | | |
|---|---|---|---|
| 6,111,322 | A | 8/2000 | Ando et al. |
| 6,114,048 | A | 9/2000 | Jech et al. |
| 6,197,859 | B1 | 3/2001 | Green et al. |
| 6,219,243 | B1 | 4/2001 | Ma et al. |
| 6,226,187 | B1 | 5/2001 | Questad et al. |
| 6,292,367 | B1 | 9/2001 | Sikka et al. |
| 6,295,200 | B1 | 9/2001 | Schmidt |
| 6,343,647 | B2 | 2/2002 | Kim et al. |
| 6,430,043 | B1 | 8/2002 | Osburn |
| 6,451,155 | B1 | 9/2002 | Toy et al. |
| 6,462,410 | B1 | 10/2002 | Novotny et al. |
| 6,475,429 | B2 | 11/2002 | Osada et al. |
| 6,504,242 | B1 | 1/2003 | Deppisch et al. |
| 6,555,906 | B2 | 4/2003 | Towle et al. |
| 6,602,777 | B1 | 8/2003 | Kao et al. |
| 6,667,548 | B2 | 12/2003 | O'Connor et al. |
| 6,707,073 | B1 | 3/2004 | Yamamoto et al. |
| 6,751,099 | B2 | 6/2004 | Vrtis et al. |
| 6,784,540 | B2 | 8/2004 | Cardwell |
| 6,791,839 | B2 | 9/2004 | Bhagwagar |
| 6,803,328 | B2 | 10/2004 | McCullough |
| 6,818,477 | B2 | 11/2004 | Veitschegger et al. |
| 6,867,978 | B2 | 3/2005 | Whittenburg et al. |
| 6,987,671 | B2 | 1/2006 | Houle |
| 7,027,477 | B2 | 4/2006 | Sutter et al. |
| 2001/0006041 | A1 | 7/2001 | Wensel |
| 2002/0092163 | A1 | 7/2002 | Fraivillig |
| 2002/0135984 | A1 | 9/2002 | Greenwood et al. |
| 2003/0134454 | A1 | 7/2003 | Houle |
| 2003/0150604 | A1 | 8/2003 | Koning et al. |
| 2003/0178720 | A1 | 9/2003 | Rumer et al. |
| 2003/0178730 | A1 | 9/2003 | Rumer et al. |
| 2004/0066630 | A1 | 4/2004 | Whittenburg et al. |
| 2004/0118501 | A1 | 6/2004 | Chiu et al. |
| 2004/0124526 | A1 | 7/2004 | Matayabas, Jr. et al. |
| 2004/0125563 | A1 | 7/2004 | Vrtis |
| 2004/0180202 | A1 | 9/2004 | Lawton et al. |
| 2004/0180474 | A1 | 9/2004 | Oman |
| 2004/0184226 | A1 | 9/2004 | Hall |
| 2004/0261980 | A1 | 12/2004 | Dani et al. |
| 2004/0262372 | A1 | 12/2004 | Houle et al. |
| 2004/0262743 | A1 | 12/2004 | Houle et al. |
| 2004/0264136 | A1 | 12/2004 | Houle |
| 2005/0027055 | A1 | 2/2005 | Dani et al. |
| 2005/0045855 | A1 | 3/2005 | Tonapi et al. |
| 2005/0056365 | A1 | 3/2005 | Chan |

FOREIGN PATENT DOCUMENTS

| | | | |
|---|---|---|---|
| WO | WO-2005006361 | A2 | 1/2005 |
| WO | WO-2005006361 | A3 | 1/2005 |

OTHER PUBLICATIONS

"U.S. Appl. No. 10/612,834, Response filed Apr. 3, 2006 Non-Final Office Action mailed Dec. 1, 2005 p. 10.pdf", 10 pgs.

"U.S. Appl. No. 10/612,834, Response filed Jul. 7, 2006 Restriction Requirement Action mailed Jul. 7, 2006 p. 6.pdf", 6 pgs.

"U.S. Appl. No. 10/05,095, Non-Final Office Action mailed Jul. 13, 2006", 11pgs.

"U.S. Appl. No. 10/405,095 Notice of Allowance mailed Dec. 11, 2007", NOAR,5.

"U.S. Appl. No. 10/405,095, Final Office Action mailed Nov. 20, 2006", 11 pgs.

"U.S. Appl. No. 10/405,095, Final Office Action mailed Mar. 13, 2006", 10 pgs.

"U.S. Appl. No. 10/405,095, Final Office Action mailed Mar. 22, 2005", 9 pgs.

"U.S. Appl. No. 10/405,095, Non-Final Office Action mailed Nov. 2, 2004", 8 pgs.

"U.S. Appl. No. 10/405,095, Non-Final Office Action mailed Aug. 4, 2005", 10 pgs.

"U.S. Appl. No. 10/405,095, Response filed Feb. 20, 2007 Final Office Action mailed Nov. 20, 2006", 11 pgs.

"U.S. Appl. No. 10/405,095, Response filed May 16, 2006 Final Office Action mailed Mar. 13, 2006", 12 pgs.

"U.S. Appl. No. 10/405,095, Response filed May 24, 2005 Final Office Action mailed Mar. 22, 2005", 9 pgs.

"U.S. Appl. No. 10/405,095, Response filed Aug. 30, 2006 Non-Final Office Action mailed Jul. 13, 2006", 12 pgs.

"U.S. Appl. No. 10/405,095, Response filed Aug. 30, 2006 Non-Final Office Action mailed Jul. 13, 2006", 14 pgs.

"U.S. Appl. No. 10/608,405, Non-Final Office Action mailed Mar. 22, 2005", 5 pgs.

"U.S. Appl. No. 10/608,405, Notice of Allowance mailed Aug. 8, 2005", 2 pgs.

"U.S. Appl. No. 10/608,405, Response filed May 23, 2005 Non-Final Office Action mailed Mar. 22, 2005", 8 pgs.

"U.S. Appl. No. 10/612,834, Notice of Allowance mailed Feb. 26, 2008", NOAR,7.

"U.S. Appl. No. 10/612,834, Notice of Allowance mailed Oct. 10, 2007", 5.

"U.S. Appl. No. 10/612,834, Final Office Action mailed Jul. 27, 2005", 7 pgs.

"U.S. Appl. No. 10/612,834, Non-Final Office Action mailed Dec. 1, 2005", 6 pgs.

"U.S. Appl. No. 10/612,834, Non-Final Office Action mailed Sep. 11, 2006", 7 pgs.

"U.S. Appl. No. 10/612,834, Non-Final Office Action mailed Sep. 8, 2004", 5 pgs.

"U.S. Appl. No. 10/612,834, Notice of Allowance mailed Apr. 24, 2007", 3 pgs.

"U.S. Appl. No. 10/612,834, Response filed Nov. 8, 2004 Non-Final Office Action mailed Sep. 8, 2004", 8 pgs.

"U.S. Appl. No. 10/612,834, Response filed Dec. 11, 2006 Non-Final Office Action mailed Sep. 11, 2006", 9 pgs.

"U.S. Appl. No. 10/612,834, Response filed Sep. 8, 2005 Final Office Action mailed Jul. 27, 2005", 9 pgs.

"U.S. Appl. No. 10/612,834, Restriction Requirement mailed Jun. 7, 2006", 6 pgs.

"Non-final office action mailed May 26, 2005 in U.S. Appl. No. 10/607,738", 7 pgs.

"Notice of allowance mailed Sep. 23, 2005 in U.S. Appl. No. 10/607,738", 5 pgs.

"Response filed Jul. 25, 2005 to non-final office action mailed May 26, 2005 in U.S. Appl. No. 10/607,738", 21 pgs.

Chang, Chin-An, "Enhanced Cu-Teflon adhesion by presputtering treatment: Effect of surface morphology changes", *Applied Physics Letters*, 51(16), (Oct. 19, 1987),1236-1238.

Perrins, L E., et al., "Mechanism for the adhesion of electroplated copper to polypropylene", *Plastics and Polymers*, 39(144), (Dec. 1971),391-397.

\* cited by examiner

IHS WITH MECHANICAL INTERLOCKING DESIGNS (SERRATION, CHANNELS)
(PRIOR ART)

HEAT DISSIPATING DEVICE WITH PRESELECTED DESIGNED INTERFACE FOR THERMAL INTERFACE MATERIALS

This application is a divisional of U.S. Patent application Ser. No. 10/612,834, filed on Jun. 30, 2003, now U.S. Pat. No. 7,527,090 which is incorporated herein by reference in its entirety.

TECHNICAL FIELD OF THE INVENTION

Embodiments of the invention relate generally to integrated circuit packages. More particularly, embodiments of the invention relate to methods and devices for improving reliability performance of thermal interface materials employed in integrated circuit packages.

BACKGROUND OF THE INVENTION

In the field of electronic systems there is an incessant competitive pressure among manufacturers to drive the performance of their equipment up while driving production costs down. This is particularly true regarding the packaging of integrated circuits, IC's, on substrates, where each new generation of packaging must provide increased performance, particularly in terms of an increased number of components and higher clock frequencies, while generally being smaller or more compact in size. As the density and clock frequency of IC's increase, the IC's accordingly generate a greater amount of heat. However, the performance and reliability of IC's are known to diminish as the temperature to which they are subjected increases, so it becomes increasingly important to adequately dissipate heat from IC environments, including IC packages.

An IC substrate typically comprises a number of metal layers selectively patterned to provide metal interconnect lines (referred to herein as "traces"), and one or more electronic components mounted on one or more surfaces of the substrate. The electronic component or components are functionally connected to other elements of an electronic system through a hierarchy of electrically conductive paths that include the substrate traces. The substrate traces typically carry signals that are transmitted between the electronic components, such as IC's, of the system. Some IC's have a relatively large number of input/output (I/O) terminals (also called "lands"), as well as a large number of power and ground terminals or lands.

As the internal circuitry of IC's, such as processors, operates at higher and higher clock frequencies, and as IC's operate at higher and higher power levels, the amount of heat generated by such IC's can increase their operating temperature to unacceptable levels.

Heat spreaders are employed to dissipate the heat generated. A heat spreader is usually located above the die and is thermally coupled to the die by a thermal interface material.

For the reasons stated above, and for other reasons stated below which will become apparent to those skilled in the art upon reading and understanding the present specification, there is a significant need in the art for apparatus and methods for packaging an IC on a substrate that minimize heat dissipation problems associated with high clock frequencies and high power densities.

DETAILED DESCRIPTION

One embodiment of the invention includes a heat dissipating device. The heat dissipating device includes a main body having a surface that is plated or coated with at least two different metals to form a preselected design effective for bonding to solder and for adhering to polymer. When the heat dissipating device surface comprising two different materials in a preselected design is contacted to a polymer solder hybrid (PSH) thermal interface material (TIM), the contact improves the bonding and adherence of the polymer solder hybrid to the heat dissipating device and prevents delamination of the polymer solder hybrid thermal interface material.

In a second heat dissipating device embodiment, surface perturbations, such as serrations, grooves and channels are made in the surface or surfaces of the heat dissipating device that are capable of contacting thermal interface material. The surface perturbations act to enhance adhesion and to prevent delamination between the TIM and the heat dissipating device.

One other heat dissipating device embodiment of the invention includes both of the surface features of the preselected design and one or more surface perturbations. For some embodiments, surface perturbations such as serrations, channels or grooves or combinations of serrations, channels and grooves are added to the surface in accordance with the preselected pattern of metal plating. For other embodiments, the surface perturbations are randomized. That is, for some embodiments, the perturbations form a grid or a bull's eye and for other embodiments, the perturbations are randomized. For other embodiments, the surface perturbations are positioned on a surface or surfaces that are different from the surface or surfaces treated with the preselected two metal design.

Another embodiment of the invention further includes an integrated circuit package that includes one or more of the heat dissipating device embodiments of the invention, an electronic system that includes one or more of the heat dissipating device and methods for making these devices and systems.

Delamination in polymer solder hybrid thermal interface materials contacting integrated heat spreader surfaces is a root cause for thermal interface material failure in some types of microelectronic packages. Typical nickel plated integrated heat spreaders offer good adhesion and wettability to the polymer component of the polymer solder hybrid (PSH). However, the solder component does not bond or wet the nickel heat spreader surface effectively to withstand thermomechanical stresses experienced in package reliability tests. Gold and silver plated nickel surfaces display good adhesion and wettability to the solder component of the polymer solder hybrid. However, the polymer adhesion to gold and silver is weak and fails in reliability tests.

To optimize and bridge the dual polymer solder hybrid component requirements, embodiment of the invention include a method for plating two metals in a pattern or design, wherein one metal is conducive to binding with the solder and the other metal is conducive to polymer adhesion. The duality improves the overall adhesion and bonding of the polymer solder hybrid thermal interface material to the heat dissipating device.

By preventing delamination, integrated circuits, electronic assemblies and electronic systems employing embodiments of the invention are better able to withstand warpage induced stresses and to maintain interfacial contact because the heat dissipating device embodiments of the invention have a resistance to thermomechanical stresses on the thermal interface materials (TIMs). Maintaining contact through bonding and adhesion between the polymer solder hybrid thermal interface material and integral heat spreader reduces the interfacial contact resistance and prevents thermal performance degradation.

As used herein, heat dissipating devices include but are not limited to devices such as integrated heat spreaders, heat sinks, heat fins, fans, vapor chambers and other heat removal devices. The main body of the heat dissipating device is fabricated using materials that include metals such as gold, nickel, and copper, composite materials, diamond, AlSiC, and other heat conductive materials capable of being plated.

Polymer solder hybrid (PSH) as used herein refers to an interpenetrating polymer/metal network formed in situ from a conductive particle and polymer blend. The polymer/metal network forms simultaneously with the cure of the polymer by a process known as transient liquid phase sintering (TLPS). Conductive particles in a polymer solder hybrid include metal powders and solder powders. Metal powders include copper powder, silver powder, aluminum powder, gold powder, platinum powder, palladium powder, beryllium powder, rhodium powder, nickel powder, cobalt powder, iron powder, molybdenum powder, as well as high-melting melting point alloys of any two or more of these metals, may be employed. Solder powders include Sn, Bi, Pb, Cd, Zn, Ga, In, Te, Hg, Tl, Sb, Se, Po, or mixtures of any two or more thereof, or another metal or alloy having a melting point lower than that of the metal powder in component. Polymeric resins usable in the polymer solder hybrid include any thermosetting resin (either monomeric or polymeric) that is cross-linkable by the curing agent, a metal catalyst or a hydroxyl group-bearing agent. Resins which meet this requirement include epoxies, phenolics, novalacs (both phenolic and cresolic), polyurethanes, polyimides, bismaleimides, maleimides, cyanate esters, polyvinyl alcohols, polyesters, polyureas, acrylics, polyamides, polyacrylates, polysiloxanes, cyanoacrylates, and the like. Other resin systems are modifiable to be cross-linkable by the curing agent, a metal catalyst or a hydroxyl group-bearing agent. Examples of such resins include acrylics, rubbers (butyl, nitrile, etc), polyamides, polyacrylates, polyethers, polysulfones, polyethylenes, polypropylenes, polysiloxanes, polyvinyl acetates/polyvinyl esters, polyolefins, cyanoacrylates, polystyrenes, and the like.

The heat dissipating device embodiments of the invention improve bonding and adherence of the polymer solder hybrid by employing metals that enhance both bonding to the metal and solder particles and adherence to polymeric components in the polymer solder hybrid. In one embodiment, a preselected pattern is formed by coating or plating a heat dissipating device surface with nickel and then overlaying portions of the nickel with gold to form the pattern. The gold bonds with the metal or solder in the polymer solder hybrid. The nickel adheres to the polymer in the polymer solder hybrid. As a result, both phases of the polymer solder hybrid have a compatible, effective, bonding or adhering surface.

Other metal combinations suitable for use in embodiments of the invention include nickel/silver, copper/gold, copper/silver, copper/nickel and other metal combinations wherein one of the metals improves bonding to solder and metal and the other metal improves adhesive affinity to polymer in a polymer solder hybrid. Preselected designs usable in the heat dissipating device embodiments of the invention include a checkered grid, one embodiment of which is illustrated at 10 in FIG. 1. Other pattern embodiments of the invention include a fine or a coarse square grid, a fine or coarse circle pattern, wherein the fine circle grid is illustrated at 20 in FIG. 2, a fine or a coarse bull's eye pattern, wherein the coarse bull's eye pattern is shown at 30 in FIG. 3, a pattern such as is illustrated at 40 in FIG. 4 and other patterns that improve bonding and adherence. Other patterns include but are not limited to crossing lines, and dot patterns.

Figure 7:
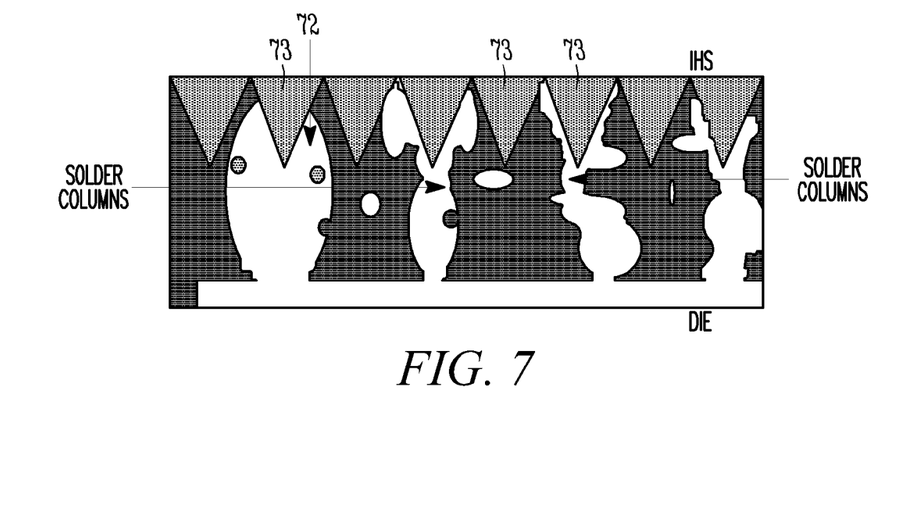
FIG. 7 illustrates a cross-sectional view of serrations in an integrated heat spreader device embodiment of the invention

Polymer adhesion to metals improves with mechanical interlocking. The adhesion between thermal interface materials and heat dissipation devices in microelectronic packages is enhanced by making perturbations such as grooves and channels into the integrated heat spreader cavity surface as shown in FIG. 7. A serrated heat spreader surface embodiment of the invention, shown at 72 in FIG. 7, provides mechanical interlocks for solder columnar structures for locking into the thermal interface material integrated heat spreader interface 73, thereby improving the interfacial adhesion and bonding.

In one embodiment, the design patterns provide additional surface area for bonding as well as mechanically anchoring the polymer to the integrated heat spreader surface. This mechanical interlocking improves intrinsic adhesion forces. Mechanical interlocking also arrests crack propagation due to the discontinuous interfacial pathways formed by the grooves and channels. The grooves and channels play a role in controlling interfacial delamination at the thermal interface material integral heat spreader interface. It is believed that any delamination crack although initiated, is trapped and stopped from growing further, by the surface perturbations, thereby controlling polymer-metal adhesion failure.

Figure 8:
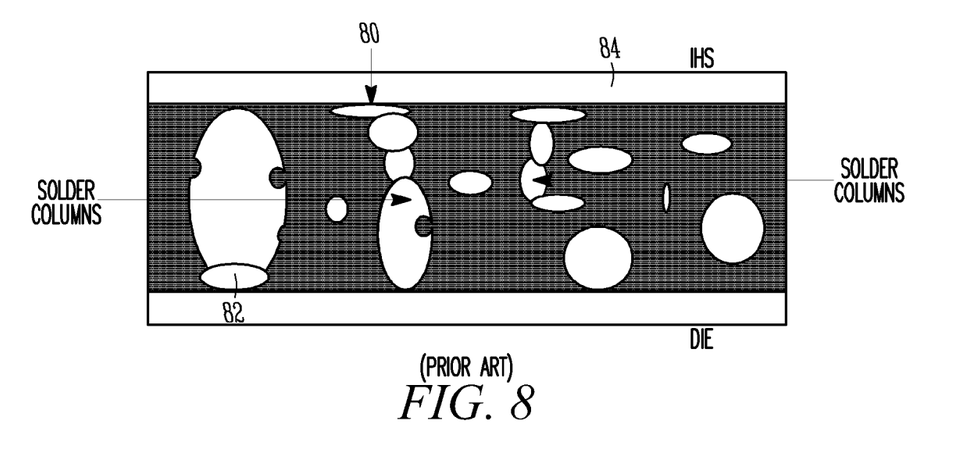
FIG. 8 illustrates a prior art interface between a thermal interface material and a heat transfer device surface.

One prior art polymer solder hybrid thermal interface material is shown in cross-section at 80 in FIG. 8. The processes of curing and reflow form predominantly solder columnar structures 82 that physically wet a flat integral heat spreader surface 84. The solder columns are not mechanically bonded to the integral heat spreader surface, however. As a result, the thermal interface material is susceptible to delamination.

Figure 9A:
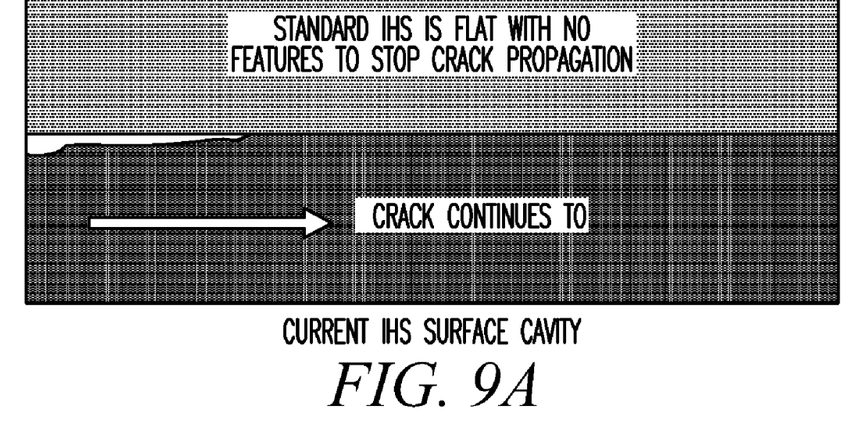
FIG. 9A illustrates schematically, an integrated heat spreader with a crack arrester.
Figure 9B:
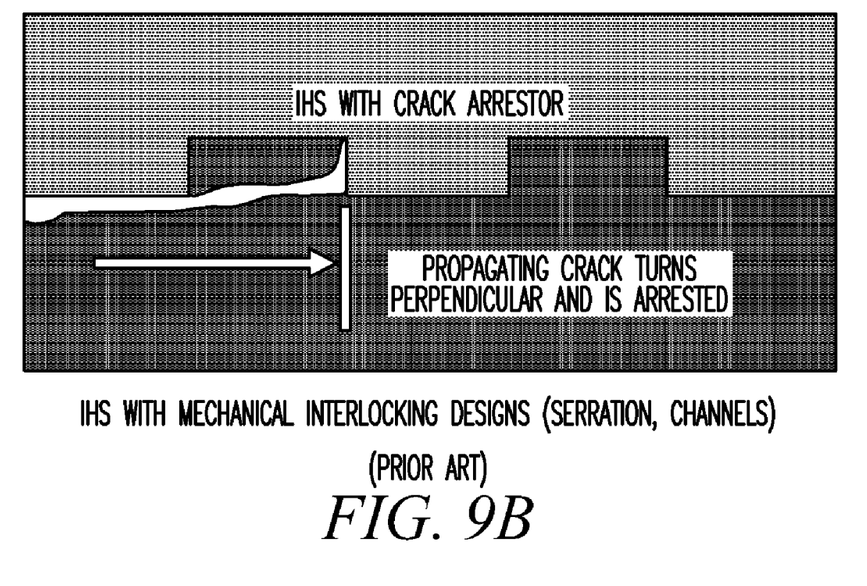
FIG. 9B illustrates schematically, a prior art integrated heat spreader free of a crack arrester.

In the absence of the serrations and channels of embodiments of the invention, a crack generated in the thermal interface material continues unchallenged, as shown in a prior art thermal interface material cross section in FIG. 9A. With an integrated heat spreader embodiment of the invention, a crack propagation in the thermal interface material turns perpendicular and is arrested, as shown in FIG. 9B.

In another perturbed surface embodiment, a pre-attached solder is applied to a serrated cavity. The pre-attached solder is applied by cold forming or by solder intermetallic compound (IMC) formations. A heat dissipating device that includes this embodiment is usable with a variety of thermal interface material technologies including polymer, polymer solder hybrid and other types of thermal interface materials. The perturbed surface embodiments that include the serrated, channeled or grooved integral heat dissipating device embodiments of the invention are also usable with a variety of thermal interface material technologies including polymer, polymer solder hybrid and other types of thermal interface materials.

Figure 3:
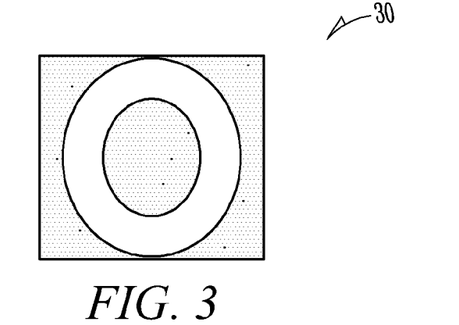
FIG. 3 illustrates a top plan view of a bull's eye pattern of the heat dissipation device embodiment of the invention.
Figure 4:
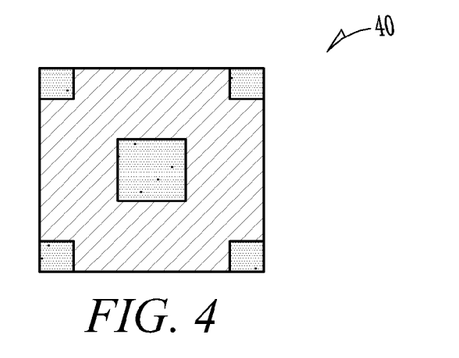
FIG. 4 illustrates a top plan view of a pattern of the heat dissipation device embodiment of the invention.
Figure 5:
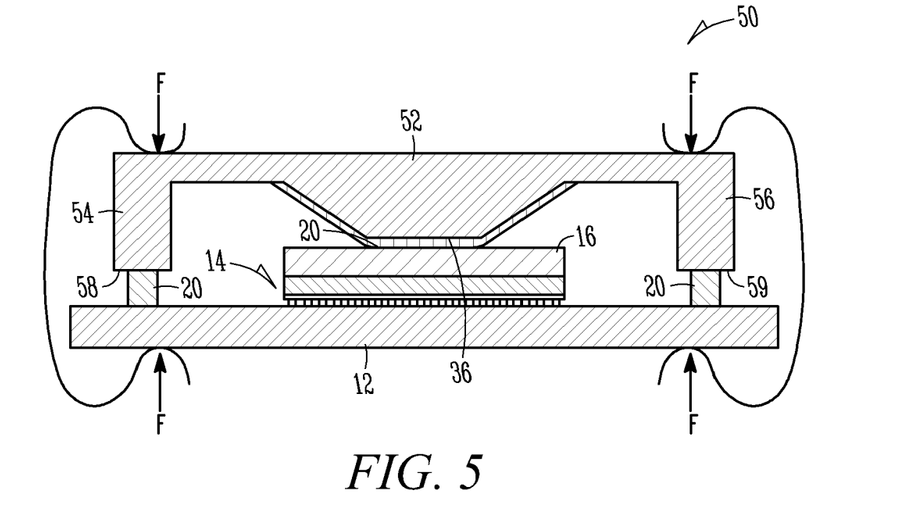
FIG. 5 illustrates a side view of a microelectronic package that includes the heat dissipation device embodiment of the invention.

In one invention embodiment, the heat dissipating device is a component 52 of a microelectronic package, such as is shown at 50 in FIG. 5. The microelectronic package also includes a package substrate 12, a die 14, a preform 16, and polymer solder hybrid material 20. The heat dissipating device 52 includes legs 54 and 56 that contact the package substrate 12. Each of the legs 54 and 56 has a surface, 58 and 59, respectively, that contacts the polymer solder hybrid material 20. These surfaces, 58 and 59, have the preselected design that both adheres and bonds the heat dissipating device 52 to the package substrate. The heat dissipating device 52 also includes surface 36 that opposes the preform 16. A layer of polymer solder hybrid thermal interface material 20 contacts the preform 16 and the heat dissipating surface 36. The heat dissipating device surface 36 also includes one of the preselected design embodiments of the invention, other embodiments of which are shown in FIGS. 1-4.

While a heat dissipating device is shown having the preselected design on surfaces 58, 59, and 36, it is understood that other embodiments include the preselected design on one or more other surfaces contacting a polymer solder hybrid thermal interface material.

Further, the preselected design on surface 36 is, for some embodiments, the same as the preselected design on surfaces 58 and 59. For other embodiments, the preselected designs on separate surfaces are different. In other embodiments, the heat dissipating device has one single design that that extends over the heat dissipating device surface.

Additional embodiments further include perturbations defined by one or more of surfaces 36, 58 and 59. The perturbations include serrations and channels. In other embodiments, the perturbations include pre-attached solder.

Figure 6:
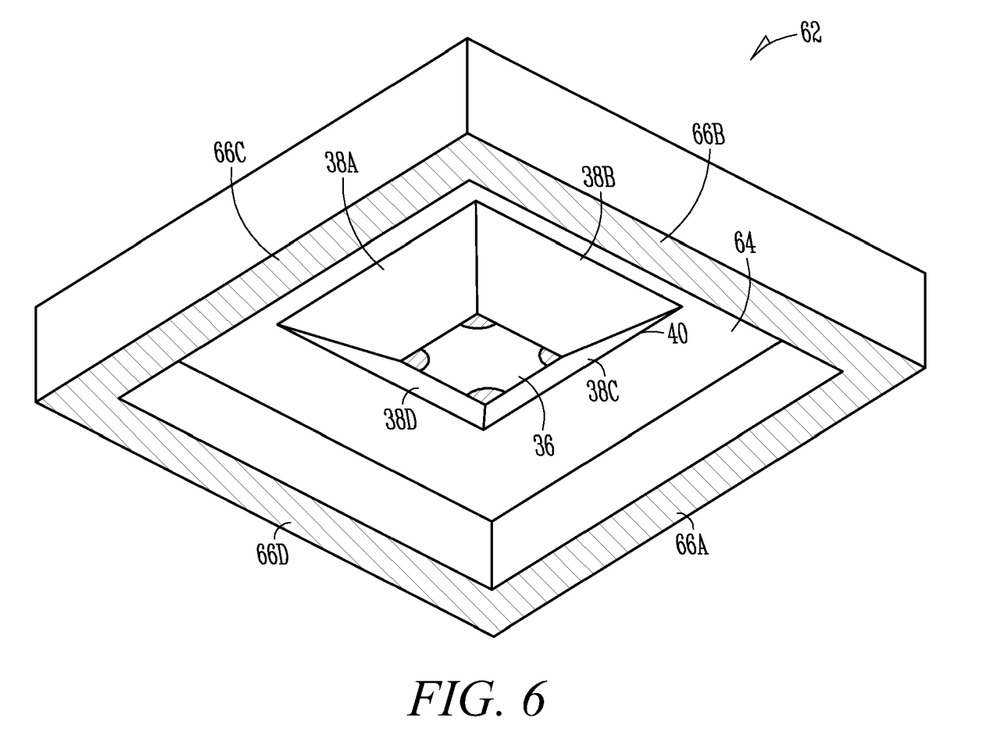
FIG. 6 illustrates a perspective view of the heat dissipation device embodiment of the invention.

One exemplary heat dissipating device 62 invention embodiment, is illustrated in FIG. 6. The device 62 is made of a highly thermally conductive material. The shape of the device 62 is obtained in a stamping operation. The device 62 includes a central heat spreader portion 64 and four bottom surfaces 66A, 66B, 66C and 66D. Each bottom surface 66A-D extends from a respective edge of the heat spreader 64.

The heat spreader device 62 includes a square region 40 and a central face 36 wherein the central face 36 is located in a lower plane than the region 40. Inclined faces 38A-D form walls between the square plane 40 and the central face 36.

The patterned metal plating is applied, in one embodiment, on the surface of the central face 36 that is positioned to oppose a preform, such as is shown at 16 in FIG. 5. The patterned metal plating is also applied to surfaces of 66A, 66B, 66C, and 66D that contact polymer solder hybrid TIM. In the embodiment shown, a circle grid is applied to the surfaces 66A-D. A bull's eye design is applied to surface 36. Channels are formed around the circles in the grid design. Serrations are formed around the bull's eye in the surface 36.

One method of application includes use of a fine mask for patterned plating. The patterned metal plating is usable on with any type of heat dissipating device capable of being plated.

In another heat dissipating device embodiment, illustrated at 70 in FIG. 7, the device 70 includes a surface that defines one or more of grooves, channels, serrations or other features capable of functioning as mechanical interlocks. The interlocks mechanically interlock a temperature interstitial material to the heat dissipating device surface. The interlocks improve adhesion between the heat dissipating device surface 72 and the TIM 74. Additionally, the grooves, channels, and serrations arrest delamination crack propagation. In particular, the grooves, channels and serrations increase the surface area available for bonding and mechanical interlocking with the TIM and improve interfacial adhesion and robustness.

In making a package employing the heat dissipating device 70, the solder component of the thermal interface material flows completely over the serrated integrated heat transfer surface. The reflowed solder thermal interface material bonds to the solder component in the polymer solder hybrid thermal interface material serrated integrated heat spreader surface, forming continuous pathways between the integrated heat spreader and the die interfaces. The improved TIM-integrated heat spreader surface adhesion reduces contact resistance at the interface and improves thermal performance of the package.

Integrated circuits (IC's) that employ the heat dissipating device embodiments of the invention are typically assembled into packages by physically and electrically coupling them to a substrate made of organic or ceramic material. One or more IC packages are physically and electrically coupled to a printed circuit board (PCB) to form an "electronic assembly".

Figure 10:
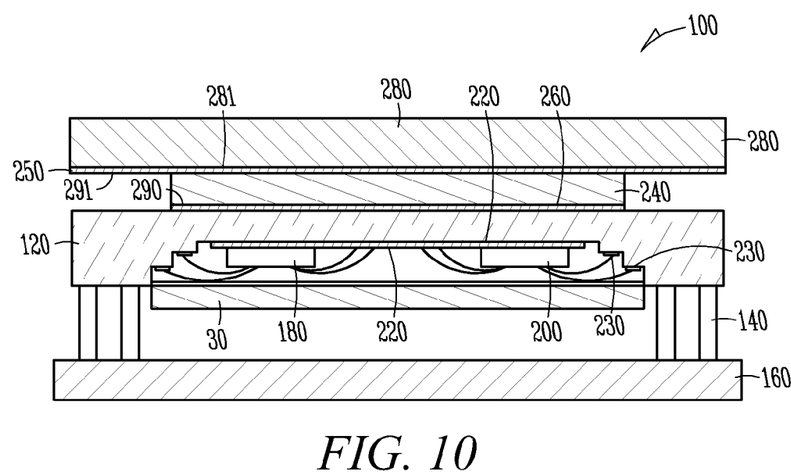
FIG. 10 illustrates a cross-sectional view of a multi-die assembly that includes a heat dissipation device embodiment of the invention with electronic devices positioned side-by-side.

A multi-die assembly embodiment 100 of the invention is shown in FIG. 10. The assembly 100 includes a package 120. Extending from the package 120 are a plurality of pins 140 that are soldered to an external printed circuit board 160. The printed circuit board 160 optionally includes other integrated circuit packages that are also mounted to the board 160 which communicate with the devices within the assembly 100. The package 120 is constructed from materials that include molded plastic, co-fired ceramic or any other suitable electronic packaging material. The package 120 contains internal routing, which is not shown, to provide power and signals to the devices within the assembly 100. Although a plurality of pins 140 are shown and described, it is to be understood that the assembly 100 includes a plurality of solder pads that are soldered to the printed circuit board 160.

Mounted to the package 120 are a first electronic device 180 and a second electronic device 200. The electronic devices include any passive or active electrical device. By way of example, the first device 180 is a microprocessor and the second device 200 is a second level cache memory chip. The devices 180 and 200 are electrically interconnected within the assembly 100. The electronic devices 180 and 200 are connected by a tape automated bonding (TAB) tape 220 that is attached to corresponding bonding pads 230 of the devices and the package 120. The bonding pads 230 are connected to the pins 140 by internal routing of the package 120. The TAB tape 220 has routing that allows the first electronic device 180 to access the second electronic device 200 without having to route signals through the package 120 and external circuit board 160, thereby improving the speed and performance of the system. Although only two electronic devices are shown and described, it is to be understood that the assembly 100 optionally includes additional devices.

The electronic devices 180 and 200 both generate heat. In one embodiment, one device generates more heat than the other device so that the operating temperatures of the devices are different. For example, the first electronic device 180 generates more heat, and thus operates at a higher temperature, than the second electronic device 200.

A heat spreader 240 is coupled to both electronic devices 180 and 200 to more evenly spread the heat and create a relatively uniform temperature profile for the two devices. The heat spreader 240 allows heat to flow from one device to the other device, so that both devices operate at approximately the same temperature. The heat spreader 240 provides a heat sink, which has a base temperature that is common for both devices. The heat spreader 240 is preferably constructed from copper, aluminum or some other thermally conductive material. In one embodiment, the package 120 contains a plurality of thermal vias that provide a direct thermal path from the devices to the heat spreader 240.

Figure 1:
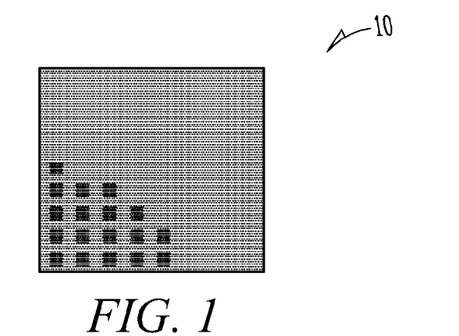
FIG. 1 illustrates a top plan view of a checkered grid design of the heat dissipation device embodiment of the invention.
Figure 2:
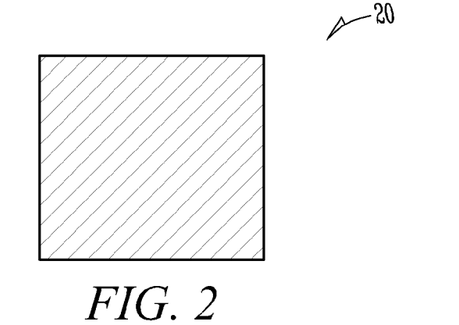
FIG. 2 illustrates a top plan view of a circle pattern grid design of the heat dissipation device embodiment of the invention.

The heat spreader 240 is mounted to the package with a thermal interface material 260. The surfaces 290 and 291 of the heat spreader 240 that contact the thermal interface material 260 are each patterned with a plated or coated design, such as is shown in FIGS. 1, 2 and 3. In one embodiment, the surfaces 290 and 291 of the heat spreader 240 also include perturbations, such as channels, serrations, and grooves. In another embodiment, the surfaces 290 and 291 of the heat spreader include perturbations but are not plated or coated. In another embodiment, one of the heat spreader surfaces 290 is coated or plated with a pattern such as is shown in FIGS. 1, 2, or 3 or other preselected design. The other heat spreader surface 291 includes perturbations, channels or serrations. In another embodiment, the heat spreader surface 291 has a different design pattern from the heat spreader surface 290.

To reduce the thermal resistance of the assembly 100, a heat slug 280 is attached to the heat spreader 240. The heat slug 280 is constructed from a thermally conductive material such as copper or aluminum. The heat slug 280 is attached to the heat spreader 240 by thermal interface material 250 at surface 281. The surface 281 is, in one embodiment, also coated or plated to form a pattern such as is shown in FIGS. 1, 2 or 3 or other preselected design. In another embodiment, the surface 281 includes perturbations.

The heat slug 280 includes a top that is typically exposed to the ambient and provides a heat transfer surface between the assembly 100 and the surrounding air. The heat spreader 240 and slug 280 are, for some embodiments, embedded in a plastic package or bonded to a ceramic package. The package includes a lid 30 to enclose the devices 18.

Figure 11:
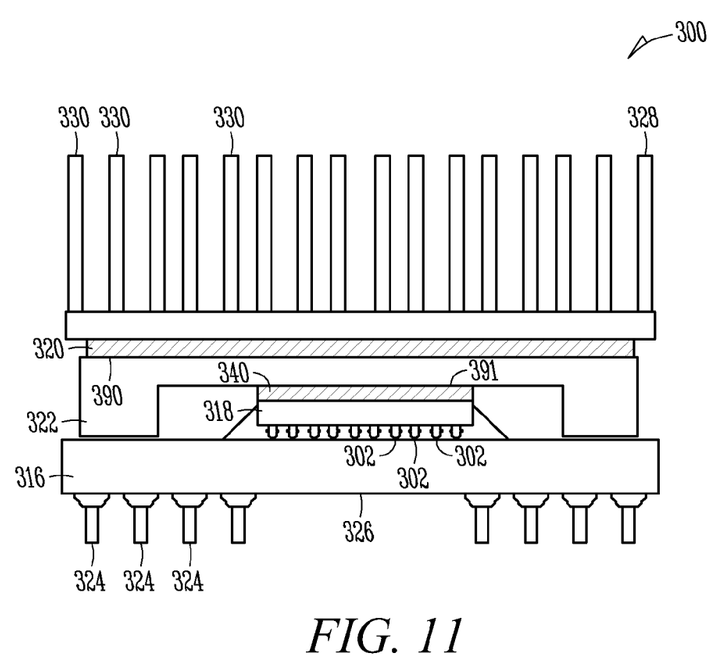
FIG. 11 illustrates a cross-sectional view of a multi-die assembly that includes a heat dissipation device embodiment of the invention with stacked electronic devices.

Another integrated circuit package embodiment of the invention, that includes dies in a stacked configuration, shown at 300 in FIG. 11, includes thermal interface material at 320 and 340. The integrated circuit package 300 also includes a substrate 316 electrically coupled to an integrated circuit or die 318 by solder bumps 302 utilized in a process commonly referred to as controlled collapsed chip connection (C4). A thermal interface material 340 is used as thermal material between the integrated circuit or die 318 and an integrated heat spreader 322. Some embodiments of the integrated circuit package include a plurality of pins 324 that are attached to a bottom surface 326 of the substrate 316.

The integrated circuit or die 318 generates heat that is removed from the integrated circuit package 300. The integrated heat spreader 322 is thermally coupled to the integrated circuit 318 to facilitate removal of heat from the integrated circuit 318. The heat spreader 322 includes metal and metal alloys that include gold, nickel, and copper, composite materials, diamond, AlSiC, and other heat conductive materials. In some embodiments, the metal and metal alloys are optionally coated with another metal or include a thermally conductive composite material.

To decrease the thermal impedance between the integrated circuit 318 and the heat spreader 322, thermal interface material 340 is placed between the integrated circuit 318 and the heat spreader 322. In one embodiment, the thermal interface material used includes a polymer solder hybrid composition that includes fusible particles and non-fusible filler particles.

The heat spreader 322 includes surfaces 390 and 391 that contact the thermal interface material 320 and 340, respectively. Each of the surfaces 390 and 391 are patterned with a plated or coated design, such as is shown in FIGS. 1, 2 and 3 or other preselected design. In one embodiment, the surfaces 390 and 391 of the heat spreader 322 also include perturbations, such as channels, serrations, and grooves. In another embodiment, the surfaces 390 and 391 of the heat spreader include perturbations but are not plated or coated. In another embodiment, one of the heat spreader surfaces 390 is coated or plated with a pattern such as is shown in FIGS. 1, 2, or 3 or other preselected design. The other heat spreader surface 391 includes perturbations, channels or serrations. In another embodiment, the heat spreader surface 391 has a different design pattern from the heat spreader surface 390.

The integrated circuit package 300 also includes a thermal element such as a heat sink, shown at 328, which has a plurality of fins 330. To decrease the thermal impedance between the integrated circuit 318 and the thermal element 328, the second thermal interface material 320 is applied and is placed between the heat spreader 322 and the thermal element 328. The second thermal interface material 320, for some embodiments, includes the same polymer as the first thermal interface material 340. For other embodiments, the second thermal interface material 320 includes a different polymer from the first thermal interface material 340.

Figure 12:
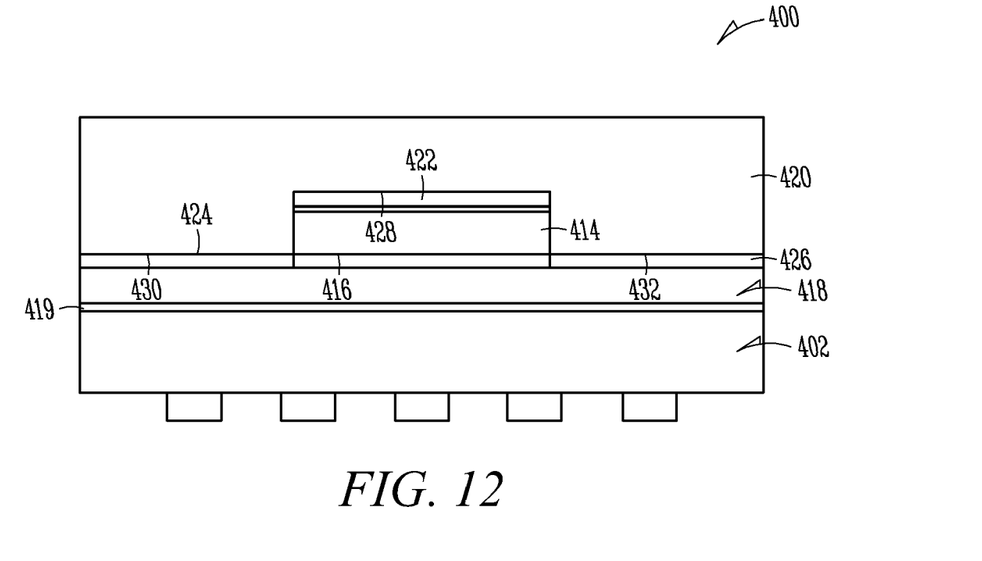
FIG. 12 illustrates a cross-sectional view of a die assembly that includes a metal substrate stiffener and a heat dissipation device embodiment of the invention.

One other integrated circuit package, illustrated at 400 in FIG. 12, includes a metal substrate 402 and a stiffener 418, overlaying the metal substrate. The stiffener 418 is adhered to the metal substrate 402 by an adhesive, which, in one embodiment, is a thermal interface material 419. A die 414 overlays the stiffener 418 and is adhered by an adhesive, which in one embodiment, is a thermal interface material 416. An integrated heat spreader 420 overlays the die 414 and the stiffener 418. Thermal interface material adheres the integrated heat spreader 420 to the die 414 at 422. Thermal interface material adheres the heat spreader 420 to the stiffener 418 at 422 and 426.

The integrated heat spreader includes a surface 428 that faces the die 414 and surfaces 430 and 432 that face the stiffener. Each of the surfaces 428, 430 and 432 are patterned with a plated or coated design, such as is shown in FIGS. 1, 2 and 3 or other preselected design. In one embodiment, the surfaces 428, 430 and 432 of the heat spreader 420 also include perturbations, such as channels, serrations, and grooves. In another embodiment, the surfaces 428, 430 and 432 of the heat spreader 420 include perturbations but are not plated or coated. In another embodiment, one of the heat spreader surfaces 428 is coated or plated with a pattern such as is shown in FIGS. 1, 2, or 3 or other preselected design. The other heat spreaders surface 430 and 432 includes perturbations, channels or serrations. In another embodiment, each of the heat spreader surfaces 428, 430 and 432 has a different design pattern from the heat spreader surface 390.

Figure 13:
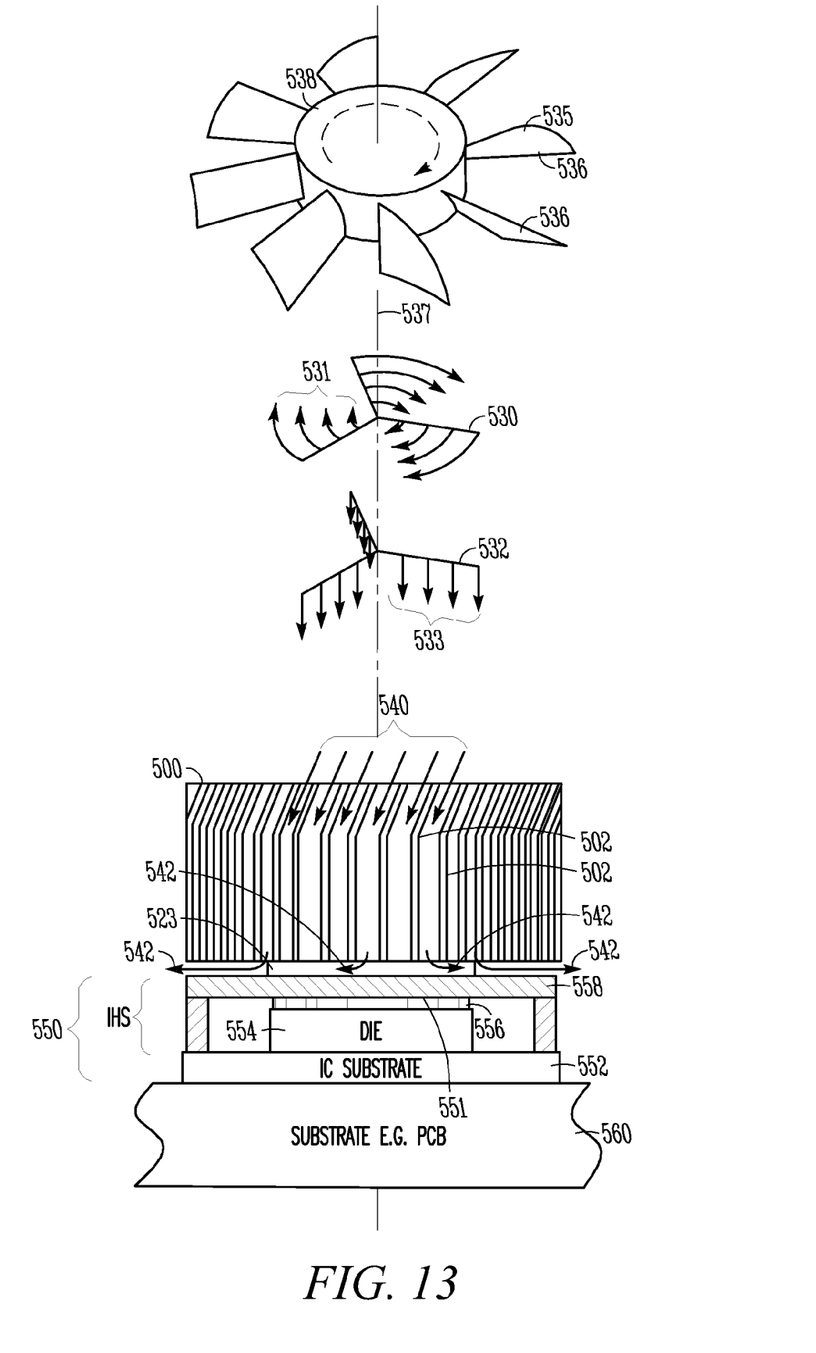
FIG. 13 illustrates a schematic view of a fan, including its tangential and axial air flow components, and a side view of a bent fin heat sink as positioned upon a sectioned integrated circuit (IC) package on a substrate, in accordance with one embodiment of the invention.

FIG. 13 illustrates a schematic view of a fan 535, including its tangential air flow component 530 and its normal air flow component 532, and a side view of a bent fin heat sink 500 as positioned upon a sectioned IC package 550 on a substrate 560, in accordance with one embodiment of the invention.

The fan 535 is an axial flow fan having a plurality of fan blades 536, rotating in a direction indicated by arrow 538, and disposed about an axis of rotation 537. The fan 535, when rotating about axis 537, produces an air flow that can be analyzed as having two different components. A tangential component 530 comprises a plurality of angular vectors 531 generally increasing towards the fan blade periphery. An axial component 532 comprises a plurality of downward vectors 533, again generally increasing towards the fan blade periphery.

Because the fins 502 of bent fin heat sink 500 are angled towards, or face, the tangential component 530, a relatively greater air flow, represented by arrows 540, is captured and flows downward between fins 502, exiting in the direction of arrows 542 beneath bent fin heat sink 500.

A thermal plug 523 of bent fin heat sink 500 is in thermal contact with an IC package 550. IC package 550, illustrated in cross-section, includes a die 554 mounted on a package substrate 552 and covered with a lid or integrated heat spreader (IHS) 558. The heat spreader includes a surface that is coated or plated to form a design, such as has been described for previous embodiments. A thermal interface material 556 is located between die 554 and IHS 558. Likewise, a thermal interface material is optionally used, between IHS 558 and thermal plug 523. Some of the relative dimensions of the structures shown in FIG. 14 are exaggerated or diminished, and they are not drawn to scale. For example, in a different embodiment the thermal plug 523 could be as wide as IHS 550, with bent fin heat sink 100 accordingly widened to accommodate an IHS 550 of such width.

The heat spreader 550 includes a surface 551 that adheres to the die 554 by the thermal interface material 556. The surface 551 is patterned or coated to form a design as has previously been described herein. The surface 551 optionally includes perturbations described herein. In another embodiment, the surface 551 includes perturbations but is not coated or plated to form a preselected design.

The "electronic assembly" is part of an "electronic system." An "electronic system" is broadly defined herein as any product comprising an "electronic assembly". Examples of electronic systems include computers (e.g., desktop, laptop, hand-held, server, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, MP3 (Motion Picture Experts Group, Audio Layer 3) players, etc.), and the like.

Thus, since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes, which come within the meaning and range of equivalency of the claims, are intended to be embraced therein.

What is claimed is:

1. A method for preventing delamination of thermal interface materials contacting a heat dissipating device, comprising:
    plating a surface of the heat dissipating device with at least two different metals wherein the at least two different metals form a design effective for bonding to solder and for adhering to polymer, wherein the surface contacts the thermal interface material; and
    adding perturbations to the surface of the heat dissipating device, wherein adding perturbations includes adding channels as the perturbations.

2. A method for preventing delamination of thermal interface materials contacting a heat dissipating device, comprising:
    plating a surface of the heat dissipating device with at least two different metals wherein the at least two different metals form a design effective for bonding to solder and for adhering to polymer, wherein the surface contacts the thermal interface material; and
    adding perturbations to the surface of the heat dissipating device wherein adding perturbations includes adding grooves as the perturbations.

3. A method for preventing delamination of thermal interface materials contacting a heat dissipating device, comprising:
    plating a surface of the heat dissipating device with at least two different metals wherein the at least two different metals form a design effective for bonding to solder and for adhering to polymer, wherein the surface contacts the thermal interface material; and
    adding perturbations to the surface of the heat dissipating device wherein adding perturbations includes adding serrations as the perturbations.

* * * * *